United States Patent
Moison et al.

(10) Patent No.: US 10,674,628 B2
(45) Date of Patent: Jun. 2, 2020

(54) COOLING MODULE AND POWER CONVERTER COMPRISING SUCH A COOLING MODULE

(71) Applicant: MERSEN France SB SAS, Saint-Bonnet-de-Mure (FR)

(72) Inventors: Yannick Moison, Echirolles (FR); Mickael Debeze, La Motte-d'Aveillans (FR); Jérome Giolat, Saint Teoffray (FR); Jean-Luc Dubelloy, La Mure (FR)

(73) Assignee: MERSEN FRANCE SB SAS, Saint-Bonnet-de-Mure (FR)

( * ) Notice: Subject to any disclaimer, the term of this patent is extended or adjusted under 35 U.S.C. 154(b) by 40 days.

(21) Appl. No.: 15/975,256

(22) Filed: May 9, 2018

(65) Prior Publication Data
US 2018/0332736 A1 Nov. 15, 2018

(30) Foreign Application Priority Data
May 11, 2017 (FR) .................................... 17 54142

(51) Int. Cl.
*H05K 7/20* (2006.01)
*F28F 13/06* (2006.01)

(52) U.S. Cl.
CPC ......... *H05K 7/20263* (2013.01); *F28F 13/06* (2013.01); *H05K 7/20254* (2013.01);
(Continued)

(58) Field of Classification Search
None
See application file for complete search history.

(56) References Cited

U.S. PATENT DOCUMENTS 7,104,312 B2 * 9/2006 Goodson ............... F04B 19/006
165/104.33
7,334,630 B2 * 2/2008 Goodson ............... F04B 19/006
165/104.33

(Continued)

FOREIGN PATENT DOCUMENTS

CN    205211737    5/2016
WO    WO-0004583   1/2000

OTHER PUBLICATIONS

Search Report for FR 1754142, dated Jan. 17, 2018.

*Primary Examiner* — Courtney L Smith
(74) *Attorney, Agent, or Firm* — B. Aaron Schulman, Esq.; Stites & Harbison, PLLC

(57) ABSTRACT

This cooling module comprises a housing, which has an external support face comprising means for fastening power conversion modules on the external support face, and a heat transfer fluid network comprising branches extending in the housing in a network plane occupying an individual zone. Each branch comprises a supply collector, a discharge collector and several individual sub-branches. Each sub-branch is connected to the supply collector via an inlet end of the sub-branch in question, is connected to the discharge collector via an outlet end of the sub-branch in question, occupies an individual sub-zone comprised in the zone of the branch in question, and is deviated relative to the other sub-branches between the supply collector and the discharge collector. Each sub-branch forms a single channel that has an undulation with a regular pitch.

13 Claims, 3 Drawing Sheets

(52) U.S. Cl.
CPC ..... *H05K 7/20272* (2013.01); *H05K 7/20281* (2013.01); *H05K 7/20927* (2013.01)

(56) References Cited

U.S. PATENT DOCUMENTS

| | | | |
|---|---|---|---|
| 9,042,100 | B2 | 5/2015 | Kang |
| 10,279,653 | B2 * | 5/2019 | Takagi ............... B60H 1/00914 |
| 2003/0164231 | A1 * | 9/2003 | Goodson ............... F04B 19/006 |
| | | | 165/104.11 |
| 2004/0104012 | A1 * | 6/2004 | Zhou .................... H01L 23/427 |
| | | | 165/104.26 |
| 2006/0096738 | A1 | 5/2006 | Kang et al. |
| 2010/0246117 | A1 * | 9/2010 | Brunschwiler ........... G06F 1/20 |
| | | | 361/679.53 |
| 2012/0257354 | A1 * | 10/2012 | Dede .................... H01L 23/473 |
| | | | 361/703 |
| 2015/0348869 | A1 * | 12/2015 | Joshi ................. H01L 23/4735 |
| | | | 361/700 |
| 2016/0183409 | A1 * | 6/2016 | Zhou ................. H05K 7/20281 |
| | | | 361/699 |

\* cited by examiner

COOLING MODULE AND POWER CONVERTER COMPRISING SUCH A COOLING MODULE

The present invention relates to a cooling module and a power converter comprising such a cooling module, as well as power conversion modules.

The present invention relates to the general field of electric power converters, for example of the inverter type, in particular for powering and controlling motors, or the conversion of energy in the context of electricity production. The controlled and powered motors are for example vehicle traction motors, for example for railway vehicles, work motors on board agricultural vehicles, heavy equipment or mining vehicles, or industrial or household automation motors. The electricity production in question may for example be of thermal, wind or solar origin, in an industrial or household activity.

One known converter comprises a plurality of conversion modules, fixedly arranged on a cooling system, forming a plate, while being arranged so as to be parallel. Each conversion module comprises semiconducting components including transistors and diodes, working in parallel, in particular insulated gate bipolar transistors (IGBT). The cooling plate is traveled by a network of channels for a heat transfer fluid circulated to cool the modules, which generate significant heat when they run. The cooling network of this converter comprises several cooling arms diverted relative to one another. Each cooling branch comprises a single continuous channel, which winds over the entire surface of the module to be cooled.

However, this known cooling system does not make it possible to obtain a balanced distribution of the temperature from one module to another, and, within each module, from one sub-module to another. These temperature differences affect the electrical properties of the conversion components, which is detrimental to the general quality of the electrical conversion, in particular if the components are used in parallel.

U.S. Pat. No. 9,042,100 B2 discloses an assembly for cooling power components generating heat. This known system implements striking jets for cooling the components. However, the use of striking jets may be detrimental to the uniformity of the cooling done.

The invention therefore seeks to resolve these drawbacks by proposing a new cooling module, for an electric power converter, the cooling module making it possible to improve the distribution of the temperature in the electric converter, while generating effective cooling.

The invention relates to a cooling module for an electric power converter, the cooling module comprising:
 a housing, which has an external support face comprising means for fastening power conversion modules on the external support face, and
 a heat transfer fluid network, the network comprising individual heat transfer fluid branches, deviated relative to one another, each branch extending in the housing in a network plane parallel to the external support face, each branch occupying an individual zone in the network plane.

Each branch comprises:
 a heat transfer fluid supply collector,
 a heat transfer fluid discharge collector, and
 several individual heat transfer fluid sub-branches, each sub-branch:
  being connected to the supply collector via an inlet end of the sub-branch in question,
  being connected to the discharge collector via an outlet end of the sub-branch in question,
  occupying an individual sub-zone comprised in the zone of the branch in question,
  being deviated relative to the other sub-branches between the supply collector and the discharge collector, and
  forming a single heat transfer fluid channel that connects the inlet end to the outlet end.

According to the invention, the single channel of each sub-branch is formed, in the network plane, with an undulation having a regular pitch.

Owing to the invention, when the network is supplied with heat transfer fluid, for each branch, the heat transfer fluid reaches each of the sub-branches at practically the same temperature. The sub-zones defined by the sub-branches being distributed in the zone of the branch in question, this uniform temperature is distributed in this zone. When a conversion module is arranged across from this zone, while being fastened on the external support face set out for that purpose, the cooling of the module is done particularly uniformly.

The presence of the undulation of the channels of the sub-branches, and the regular pitch of these undulations, makes it possible to make the cooling more effective, despite the fact that this cooling does not implement striking jets. Nevertheless, with respect to a solution using impacting jets, the uniformity of the cooling obtained owing to the invention is greatly improved owing to the particular circulation scheme of the heat transfer fluid. The invention is therefore particularly useful if the electric power converter requires very uniform, yet efficient, cooling.

According to other optional and advantageous features of the invention, considered according to all technically allowable combinations:
 each sub-branch has a form identical to the other sub-branches in the network plane.
 each individual zone has an elongate shape defining a branch axis, the zones being arranged such that the branch axes are parallel to each other, the sub-zones of each branch being distributed along the branch axis of the branch in question.
 the single channel has a constant width.
 for each sub-branch, the pitch of the undulation is greater than the width of the single channel in question.
 the single channel of each sub-branch comprises:
  a first part, extending from the inlet end and being wound in a first spiral in the network plane, and
  a second part, extending from the outlet end to the first part and being wound in a second spiral in the network plane, interleaved in the first spiral.
 each spiral, including the first spiral and the second spiral, is quadrilateral, defining four corners with each revolution.
 for each sub-branch, the pitch of the undulation of the single channel is smaller than the largest diameter of the spirals, including the first spiral and the second spiral of the sub-branch in question.
 the network comprises:
  a main heat transfer fluid inlet collector, connected to the supply collectors of the branches, emerging outside the housing, and
  a main heat transfer fluid outlet collector, connected to the discharge collectors of the branches, emerging outside the housing.

the fastening means comprise, for each branch, at least one orifice emerging on the surface of the outer support face.

for each branch, said at least one orifice is configured for the implantation of a screw.

The invention also relates to an electric power converter, comprising:
- a cooling module according to the above,
- separate power conversion modules, which each comprise:
  - a thermal interface plate, which comprises a components face and an external contact face opposite one another, and
  - separate power conversion sub-modules, each comprising at least one semiconductor component, the sub-modules being fixedly distributed on the components face;

each power conversion module being:
- fastened, via the fastening means, on the external support face such that the external contact face is in contact with the external support face, and
- positioned such that its thermal interface plate is across from one of the zones, and such that its sub-modules are across from sub-zones of this zone.

Optionally and advantageously, each sub-module occupies, projected orthogonally in the network plane, a sub-module area, and each sub-branch is configured such that the sub-zone occupied by this sub-branch substantially coincides with the sub-module area of the opposite sub-module.

The invention will be better understood upon reading the following description, provided solely as a non-limiting example and done in reference to the appended drawings, in which.

Figure 1:
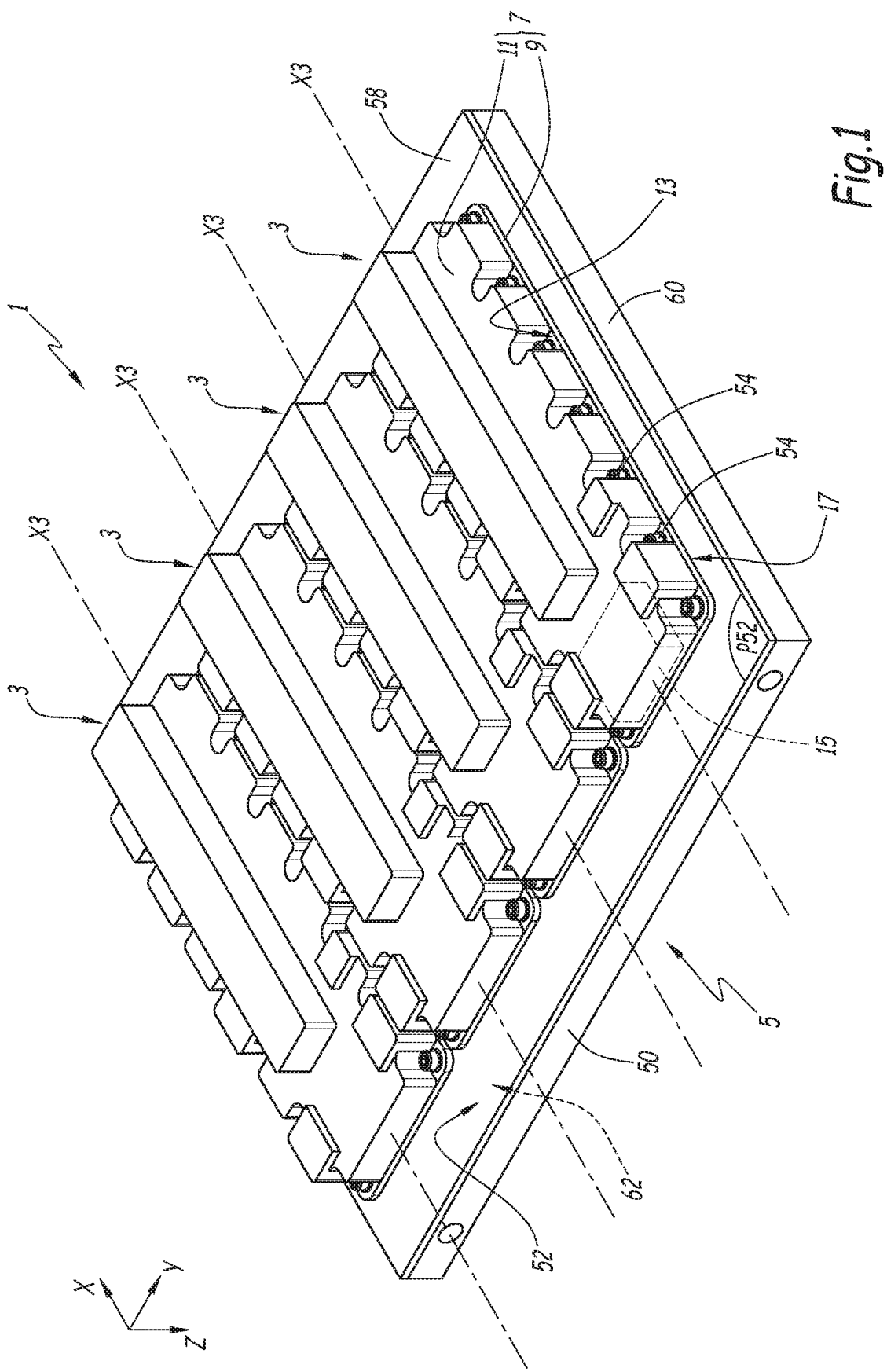
FIG. 1 is a perspective view of a power converter according to the invention, comprising a cooling module also according to the invention.

An electric power converter 1 is shown in FIG. 1.

This converter 1 operates using power electronics, based on a circuit of semiconductor components. In this example, the converter 1 is an electric converter with semiconductors, in particular an inverter or a rectifier. Alternatively, the power converter is a clipper, a switching mode power supply, or a dimmer. Based on its aforementioned type, the power converter is in particular applicable in one of the aforementioned fields, for example controlling and powering an electric motor, or converting electric energy coming from a production source.

The converter 1 of the present example preferably handles a voltage greater than 100 V.

As shown in the figures, an orthonormal coordinate system is defined with directions X, Y and Z, attached to the converter 1, to assist with the understanding of the spatial arrangement of the converter 1.

The converter 1 of FIG. 1 comprises four power conversion modules 3, which contain power conversion electronics. These modules 3 are separate from one another, i.e., they are separated and not combined. Furthermore, the modules 3 as such can be used independently of one another. Each module 3 for example has a length comprised between 10 cm and 1 m, and a width comprised between 4 cm and 20 cm. A typical module 3 has a length of about 25 cm and a width of about 7.5 cm.

Each module 3 advantageously forms an inverter arm. Alternatively, each module 3 forms an inverter switch. However, each module 3 can form another power conversion function, as a function of the desired application.

The converter 1 also comprises a cooling module 5 on which the modules 3 are fastened.

The modules 3 are preferably identical, as is the case in the present example, or at least have a similar operation. However, the modules 3 can alternatively be different in their embodiment and their operation.

Each of the modules 3 comprises a housing 7. Each housing 7 comprises a thermal interface plate 9, extending parallel to the plane XY, and an upper shell 11 that is closed by the thermal interface plate 9. In the present example, the upper shell 11 is attached on a face 13 of the plate 9.

On this same face 13, each module 3 comprises six power conversion sub-modules 15, one of which is schematically shown in FIG. 1 in dotted lines through the shell 11. Each sub-module 15 advantageously forms a substrate. Each sub-module 15 comprises at least one semiconductor component. This type of sub-module generally measures between 3 and 5 cm per side, typically about 4 cm.

In one preferred embodiment, each sub-module 15 comprises one or several switch functions and one or several diode functions, distributed. For example, a sub-module 15 may comprise four IGBTs each performing a switch function and two diodes, interconnected in a circuit. The sub-modules 15 can have other combinations of components, based on the application, which all emit relatively significant heat during operation. It is possible to provide more or less than six sub-modules 15 in each module 3 based on the application, and in particular the electric power involved. Other components can be provided in the modules 3, in addition to or in place of the sub-modules 15.

Preferably, the sub-modules 15 of each module 3 have a close operation, or are identical or similar. The sub-modules 15 are advantageously used in parallel to be able to handle, together, a high electric power, which depends on the number of connected sub-modules.

In each module 3, the sub-modules 15 are contained in the housing 7 between the plate 9 and the upper shell 11. The sub-modules 15 are fastened on the face 13 of the plate 9, called "components face". The sub-modules 15 are preferably regularly aligned without overlapping along an axis X3 of the module 3, parallel to the axis X in the configuration with the module 3 mounted in the converter 1. Thus, the housing 7 of each module 3 in turn is generally parallelepiped and elongate along the axis X3, so as to be able to marry the shape of the sub-modules 15 and thus guarantee the compactness of the module 3.

Advantageously, the different modules 3 have standard dimensions so as to be able to be easily replaced individually by other conversion modules. The converter 1 is thus modular, the combination of conversion modules installed on the cooling module being able to be modified by replacing one or several of the conversion modules, in order to adapt to the application, or even to modify the function performed by the converter, or at least its operating characteristics.

The cooling module 5 comprises a housing 50, preferably forming a thick rectangular tray, extending parallel to the plane XY. The housing 50 comprises an upper plate 58 and a lower platen 60, on which the upper plate 58 is fastened. Alternatively, the plate 58 and the platen 60 are formed in one piece. The plate 58 and the platen 60, which are generally parallelepiped, extend parallel to the plane XY and are superimposed along the axis Z.

The plate 58 forms an outer face 52 of the housing 50, extending in a plane P52 parallel to the plane XY. The plate 58 also comprises a face 62, opposite and parallel to the face 52, via which it rests on the platen 60.

The modules 3 are fastened on the cooling module 5 by means of the external face 52, which serves as support. In the case at hand, the modules 3 are distributed on the face 52, such that their axes X3 are parallel and regularly spaced apart along the axis Y.

More specifically, the modules 3 are fastened on the face 52 by means of their thermal interface plate 9. Each thermal interface plate 9 comprises an outer contact face 17 with the face 52, the face 17 being opposite and parallel to the face 13. The respective faces 17 of the plates 9 are therefore in surface contact, i.e., rest flat, on the external support face 52, preferably over the entire area of the faces 17. The thermal exchanges between the cooling module 5 and the sub-modules 15 are done through the plate 58 and the plates 9. To that end, the plates 9 and the plate 58 are advantageously made from aluminum, or any other appropriate thermally conductive material. A thermal paste is advantageously introduced between the face 17 of the plates 9 and the face 52 of the plate 58 in order to obtain better thermal conduction.

The modules 3 are fastened on the face 52 using screws 54. Preferably, these screws 54 are implanted in orifices 55, preferably tapped, of the platen 60, while traversing the plate 58 via through orifices of this plate 58, which are arranged aligned with orifices 55 of the platen 60 and emerge on the surface of the face 52. Alternatively, it is possible to provide, to implant the screws 54, blind orifices arranged in the plate 58 while emerging on the surface of the face 52, with no orifice in the platen 60. Alternatively, it is possible to provide orifices traversing the plate 58 and the platen 60, tapped over their entire length or only a portion thereof. In the present example, each module is fastened by two rows of seven screws 54, the screws 54 of each row being regularly aligned with the axis X. The screws 54 are implanted level, along the axis Y, with the separation between two successive sub-modules 15 of the module 3. The screws 54 and their respective orifices 55 constitute means for fastening the modules 3 on the module 5. The number of screws 54 and associated orifices 55 can be changed based on the application, in particular based on the number of sub-modules 15 provided for each module 3. It is considered that at least one orifice 55 is provided to accommodate a screw 54, for each module 3 to be mounted.

Alternatively, the orifices 55 can be provided to accommodate types of fastening elements other than screws, such as rivets.

Alternatively, it is possible to provide any appropriate type of fastening means based on the specific circumstances, in place of or in addition to such screws 54.

Figure 2:
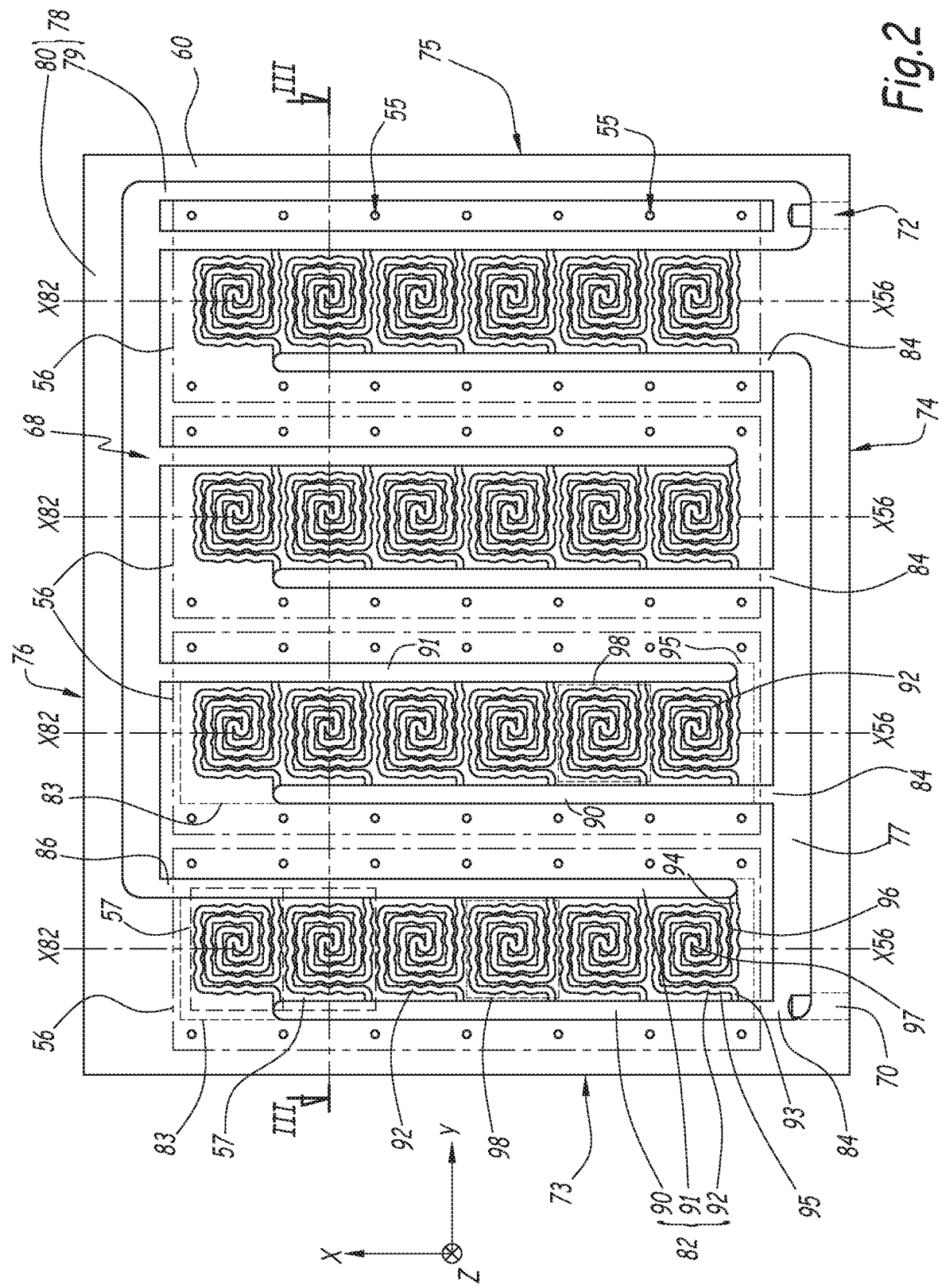
FIG. 2 is a top view of the cooling module of FIG. 1, from which an upper plate has been removed.

In general, the face 52 includes slots 56, each slot 56 corresponding to the area occupied by the face 17 of the plate 9 of one of the modules 3. These slots are shown in broken lines in FIG. 2. The slots 56 extending the plane P52 and are, in the present example, generally rectangular, with their largest axes X56 parallel to the axis X, as illustrated in FIG. 2. The rectangular shape of the slots 56 corresponds to the aforementioned width and length of the modules 3. In any case, the slots 56 are separate, i.e., they are separated and do not overlap. In the present example, without the modules 3, the slots 56 are identifiable using tapped holes provided on the plate 58, which define the contour of each of them. Irrespective of the embodiment, each slot 56 comprises means for fastening only one of the modules 3.

Figure 3:
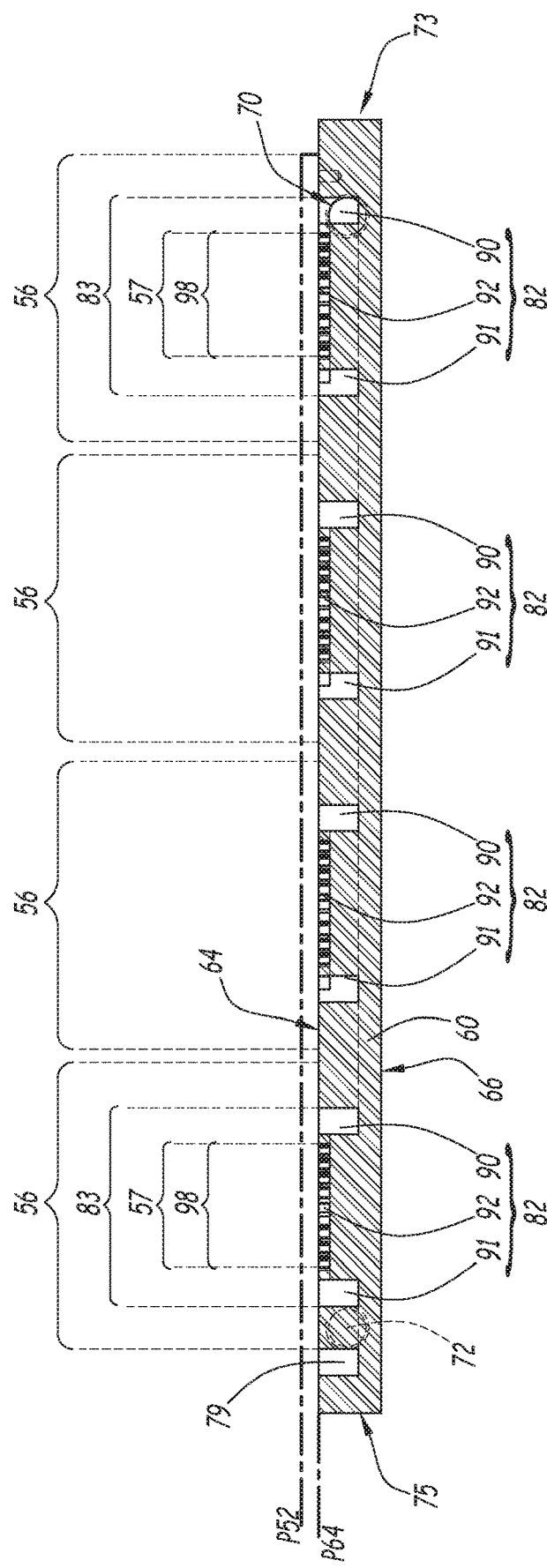
FIG. 3 a cross-section along line III-III of FIG. 2.

The lower platen 60 is shown in FIGS. 2 and 3. The platen 60 comprises an upper face 64 extending in the plane XY.

The face 64 is in sealed contact with the face 62 of the plate 58, when the upper plate 58 is fastened on the lower platen 60. The platen 60 also comprises a lower face 66 opposite and parallel to the upper face 64. The face 64 advantageously has the same rectangular shape as the plate 58.

The lower platen 60 also comprises four side faces 73, 74, 75 and 76, the faces 73 and 75 extending parallel to the plane XZ and the faces 74 and 76 extending parallel to the plane YZ.

The platen 60 is advantageously made from the same material as the plate 58, but can be made from a different material, the thermal conduction of which is lower, such that the heat exchanges are done as a priority toward the plate 58.

A heat transfer fluid network 68 is arranged in the platen 60, blindly from the face 64. The heat transfer fluid used in the network 68 is for example water, optionally glycol water.

The network 68 is formed by channels or furrows arranged in the face 64 and upwardly open, i.e., toward the plate 58 when the latter is in place on the platen 60. When the plate 58 is fastened on the platen 60, the various channels of the network 68 form tubular conduits, preferably with quadrilateral sections. Preferably, this network 68 is made by milling the face 64 of the platen 60, or any other manufacturing method by removing material. Thus, the platen 60 is advantageously formed in one piece. Alternatively, other manufacturing methods of the platen 60 are possible, such as molding.

The upper face 64 defines a plane P64, called "network plane", parallel to the plane P52, in which the network 68 extends.

As illustrated in FIG. 2, the network 68 emerges from the housing 50 level with a first orifice 70 and a second orifice 72 that are provided on the surface of the face 74. The orifice 70 is provided at one end of the face 74, close to the adjacent face 73, and the orifice 72 at an end opposite the face 74, close to the adjacent face 75. One of the two orifices 70 and 72 serves as an inlet for the coolant fluid in the network 68, and the other serves as an outlet. In the present example, the orifice 70 serves as inlet and the orifice 72 serves as outlet. The orifices 70 and 72 are provided to be connected to heat transfer fluid supply and discharge means, which provide a heat transfer fluid cold enough to allow cooling of the modules 3 by circulation of the heat transfer fluid in the network 68. For their fluid connection, each of the orifices 70 and 72 is advantageously provided with means for coupling to a coupler, such as a screw pitch, or any other means.

Alternatively, the orifices 70 and 72 can be provided on another face of the housing 50, in particular the side faces 73, 74, 75 and 76, or on the face 66. The orifices 70 and 72 can be provided on two separate faces of the housing 50.

In the present example, the network 68 comprises a main collector 77, which serves as main inlet channel while being fluidly connected to the orifice 70. The collector 77 extends along the axis Y, along the face 74, from the orifice 70 toward the face 75, so as to run alongside all of the slots 56. The collector 77 extends outside the orthogonal projection of the contour of the slots 56 on the face 64.

For the present example, all of the mentioned orthogonal projections are done along the axis Z, in the plane P64, unless otherwise explicitly mentioned. These projections may indifferently be done in any parallel plane, in particular the plane P52.

In the present example, the network 68 comprises a main collector 78, which serves as main outlet channel while being fluidly connected to the orifice 72. The collector 78 comprises a first part 79 and a second part 80, fluidly connected at one of their ends, so as to be arranged in an "L" in the plane P64. The part 79 extends along the axis X, along the face 75, and is fluidly connected to the orifice 72 at one end, while extending toward the opposite face 76. The part 80 extends along the axis Y, along the face 76, from the other end of the part 79. Similarly to the collector 77, the part 80 of the collector 78 extends so as to run alongside all of the slots 56. The collector 78, and in particular the part 80 thereof, extends outside the orthogonal projection of the contour of the slots 56.

The part 80 of the collector 78 is therefore parallel to and remote from the collector 77. In orthogonal projection, the modules 3 are arranged between the collectors 77 and 78.

The network 68 also comprises individual branches 82 arranged in the housing 50, more specifically in the platen 60. The branches 82 form channels that are arranged in the platen 60 from the face 64, i.e., in the plane P64. The branches 82 are said to be "individual", i.e., they are not combined or fluidly directly connected relative to one another. More specifically, the branches 82 are connected to one another only via collectors 77 and 78. In particular, the network 68 has no connection connecting two branches 82 directly to one another, aside from the aforementioned collectors 77 and 78. Each branch 82 comprises two fluid connections 84 and 86, preferably only two, with the other parts of the network 68, one serving as an inlet and the other serving as an outlet for the heat transfer fluid.

In the present example, each branch 82 is fluidly connected to the collector 77 via its connection 84, and to the collector 78, in particular to the part 80, via its connection 86. The connections 84 are regularly distributed parallel to the axis Y on the collector 77. The connections 86 are regularly distributed parallel to the axis Y on the part 80 of the collector 78. The collector 77 is therefore connected to all of the branches 82 so as to supply them with heat transfer fluid, and the collector 78 is connected to all of the branches 82 so as to discharge the heat transfer fluid from the latter.

Irrespective of the embodiment, it is provided that the branches 82 are deviated from one another in the network 68 between the collectors 77 and 78. In other words, all of the branches 82 receive heat transfer fluid distributed from a same source, in the case at hand, the collector 77, and discharge the heat transfer fluid toward a same destination, in the case at hand the collector 78, the heat transfer fluid having passed in one of the branches 82 not passing in the other branches 82.

Each branch 82 occupies an individual zone 83 defined in the plane P64, two of these zones 83 being shown in FIG. 2 by their contour in broken lines. These zones 83 are "individual" inasmuch as they are separated from each other and do not overlap. The zones 83 extend between the collector 77 and the part 80 of the collector 78. "Occupy" means that the branch 82 in question is the only part of the network 68 present in the considered zone 83. The zones 83 have a generally quadrilateral shape. More generally, each zone 83 is polygonal with no reentrant angles, i.e., it does not have a concave nature, in the form of an ellipse, circle or the like, and marries the contour of the branch 82 in question. Preferably, as is the case in the present example, the zones 83 are rectangular, oriented parallel to the axis X, and regularly distributed along the axis Y. The branches 82 are arranged and extend in the plane P64 such that each zone 83 is across from one of the slots 56, or more specifically, across from the plate 9 of one of the modules 3. "Across from" means that the elements in question are aligned along the axis Z, unless otherwise explicitly stated. In other words, each zone 83 is below one of the slots 56. Each branch 82 is thus dedicated solely to cooling just one of the modules 3. More specifically, as illustrated in FIG. 2, each zone 83 is comprised inside an orthogonal projection of one of the slots 56, i.e., the area covered by the plate 9 of one of the modules 3. More generally, each branch 82 extends in the plane P64 along a branch axis X82, oriented parallel to the axis X, the axes X82 being regularly distributed along the axis Y.

Each branch 82 being dedicated to cooling one of the modules 3, the same number of branches 82 is advantageously provided as there are modules 3, associating each branch 82 with a module 3. In the present example, the network 68 comprises four branches 82, which correspond to the four modules 3. Each of the fastening means of the modules 3, i.e., presently the orifices 55 and the screws 54, is associated with one of the branches 82 in order to allow the fastening of a module 3 across from this branch 82. Each branch 82 is associated with at least one fastening means of a module 3. In practice, at least one fastening means is provided across from each of the branches 82. Preferably, at least one orifice 55 is therefore provided across from each branch 82 in the face 52.

Each branch 82 being deviated from the other branches 82, the heat transfer fluid enters each of them at a close temperature, such that the cooling from one module 3 to another is particularly uniform. The temperature of the different modules 3 is then substantially equal during operation, such that the differences in electrical characteristics of the modules 3, related to the temperature, are particularly reduced. In other words, from one branch 82 to another, the cooling is done isothermally.

In the present example, and preferably, each zone 83 does not occupy the entire area defined by the orthogonal projection of its corresponding slot 56, but only part, corresponding to the slots of the sub-modules 15. "Sub-module area 57" refers to the orthogonal projection of each of the sub-modules 15. This area 57 is in particular square or rectangular. Two of the areas 57 are shown by their contours in broken lines in FIG. 2. The contour of the area 57 reproduces the aforementioned sides of the sub-module 15, the larger of these sides for example measuring about 4 cm.

In the case at hand, for each module 3, the areas 57 of the sub-modules 15 of this module 3 are included in the zone 83 of the branch 82 corresponding to this module 3. More specifically, the zone 83 marries the areas 57 of the module 3 in question, in this plane P64. The cooling is thus concentrated across from the sub-modules 15, i.e., emitted just below the sub-modules 15, the sub-modules 15 constituting the elements with the greatest heat production in the module 3. Advantageously, no or only marginal cooling is provided of the periphery of the sub-modules 15, which makes it possible to obtain uniformity of the temperature in the module 3. In other words, it is provided that, for each module 3, the part of the slot 56 outside the areas 57 is not covered by the zone 83, and even preferably left primarily, or even completely, free by the network 68, i.e., is not occupied by the network 68.

Alternatively, cooling may nevertheless be provided in the zones of the slot 56 outside the areas 57.

Each branch 82 comprises a collector 90 and a collector 91, as well as several heat transfer fluid sub-branches 92. Each collector 90 and 91 belongs to only one of the branches 82 at a time, i.e., it is not shared between two branches.

The collectors 90 and 91 extend parallel to the axis X separated from one another. The collector 90 is fluidly connected to the collector 77 via the connection 84, and the collector 91 is fluidly connected to the collector 78 via the connection 86. The collector 90 and the collector 91 each delimit a large side of the contour of the zone 83 of the branch 82 in question. When the modules 3 are fastened on the module 5, the collectors 90 and 91 extend across from the plate 9 of the module in question, i.e., in the slot 56, while being outside the areas 57. Each collector 90 and 91 extends in the plane P64.

For each branch 82, the sub-branches 92 are arranged between the collectors 90 and 91, while being distributed and aligned along the axis X82 of the branch 82 in question. The sub-branches 92 are individual, i.e., they are not combined or fluidly directly connected relative to one another. More specifically, the sub-branches 92 belonging to the same branch 82 are connected to one another only via collectors 90 and 91 of this branch 82. In particular, the network 68 has no connection connecting two sub-branches 92 directly to one another, aside from the aforementioned collectors 90 and 91.

Each sub-branch 92 belongs to only one of the branches 82 and is therefore not shared between several branches 82 of the network 68.

In the preferred embodiment illustrated in the figures, each sub-branch 92 forms a single channel, which has a heat transfer fluid inlet end 93, fluidly connected to the connector 90 of the branch 82 in question, and a heat transfer fluid outlet end 94, fluidly connected to the collector 91. "Single channel" means that, from the end 93 to the end 94, the sub-branch has no branches, a single one-way flow channel for the heat transfer fluid being provided. More generally, each sub-branch 92 comprises two fluid connections 93 and 94 with the collectors 90 and 91, preferably only two, one serving as an inlet and the other serving as an outlet for the heat transfer fluid. Preferably, each sub-branch 92 comprises only two fluid connections with the other parts of the network 68. The connections 93 and 94 of each sub-branch 92 do not connect two sub-branches 92 to each other. Preferably, the single channel of each sub-branch 92 has a width, measured in the plane XY, with a constant value, over at least the majority of its outline, or even all of its outline, as is the case in the present example. To that end, for example, each sub-branch channel 92 is formed by milling with a mill having a predetermined diameter, corresponding to the width of the formed channel. For example, a mill is provided whose diameter is comprised between 2 and 10 mm, based on the desired application. Irrespective of the method for producing the channels for the branches 82, it is advantageously provided that the passage section of each sub-branch channel 92 is comprised between 3 mm$^2$ and 100 mm$^2$ and is preferably identical from one sub-branch 92 to the next.

In the present example, in each branch 82, the collector 90 serves as supply collector for the sub-branches 92 with heat transfer fluid, more specifically, all of the sub-branches 92 of the branch 82 in question. In each branch 82, the collector 91 serves as discharge collector for the heat transfer fluid from the sub-branches 92, more specifically, all of the sub-branches 92 of the branch 82 in question.

Irrespective of the embodiment, it is provided that the sub-branches 92 are deviated from one another in the branch 82 in question. In other words, all of the sub-branches 92 of a given branch 82 receive heat transfer fluid distributed from a same source, in the case at hand, the collector 90, and discharge the heat transfer fluid toward a same destination, in the case at hand the collector 91, the heat transfer fluid having passed in one of the sub-branches 92 of the branch 82 in question not passing in the other sub-branches 92 of the same branch 82.

Each sub-branch 92 occupies an individual sub-zone 98 defined in the plane P64, inside the zone 83 of the branch 82 to which the sub-branch 92 belongs. Two of these sub-zones 98 are shown in FIG. 2. These sub-zones 98 are "individual" inasmuch as they are separated from each other and do not overlap. The sub-zones 98 extend between the collectors 90 and 91. "Occupy" means that the branch 92 in question is the only part of the network 68 present in the considered sub-zone 98. The sub-zones 98 have a generally quadrilateral shape. More generally, each sub-zone 98 is generally polygonal with no reentrant angles, and marries the contour of the sub-branch 92 in question. Preferably, the sub-zones are rectangular or square. In each branch, due to the distribution of the sub-branches 92, the sub-zones 98 are regularly distributed along the axis X82.

The sub-branches 92 are arranged and extend in the plane P64 such that each sub-zone 98 is across from one of the sub-modules 15, when the module 3 in question is fastened on the module 5. In other words, each sub-zone 98 is below one of the sub-modules 15. Preferably, each sub-branch 92 is thus dedicated solely to cooling just one of the sub-modules 15.

Alternatively, it is possible to provide that the sub-branches 92 are arranged and extend in the plane P64 such that each sub-zone 98 are slightly offset, rather than strictly across, from one of the sub-modules 15, when the module 3 in question is fastened on the module 5. This offset is for example provided parallel to the axis X.

Alternatively, it is possible to provide that one of the sub-branches is dedicated to cooling several adjacent sub-modules belonging to the same module, while being arranged across from these adjacent sub-modules. Also alternatively, it is possible to provide that only one sub-module is cooled per several adjacent sub-branches belonging to the same branch, these sub-branches then being arranged across from this sub-module.

More specifically, as illustrated in FIG. 2, each sub-zone 98 substantially coincides with the area 57 of the opposite sub-module 15. "Coincides" means that the sub-zone 98 and the area 57 have a comparable shape and size, which are superimposed in the plane P64. In particular, the area 57 and the corresponding sub-zone 98 are completely, or for the large majority, superimposed. In the case where a sub-module area and a sub-zone are provided with slightly different shapes, it is advantageously provided that one is comprised in the other in the plane P64. It is preferably provided that the sub-module area and the sub-zone are centered on a same point of the plane P64. In the present example, each sub-module area 57 protrudes, in the direction of the axis Y, over part of the collectors 90 and 92. More specifically, in the present example, each area 57 extends, parallel to the axis Y, on the one hand to the halfway point of the collector 90 and on the other hand to the halfway point of the collector 91.

Each sub-branch 92 is then dedicated solely to cooling a sub-module 15, without acting significantly on the rest of the module 3 in question. Thus, the cooling module 5 targets the cooling of the sub-modules 15 as a priority, which, within the module 3, produce a substantial quantity of heat compared to the other elements of the module 3. Due to their deviated arrangement relative to one another, the heat transfer fluid enters all of the sub-branches 15 of each branch 82 at the same temperature, which makes it possible to ensure that the cooling from one sub-module 15 to the next is particularly uniform. The temperature of the different sub-modules 15 is then substantially equal during operation, such that the differences in electrical characteristics of the sub-modules 15, related to the temperature, are particularly reduced. The cooling from one module 3 to the next also being uniform, the electrical characteristics are then uniform for all of the sub-modules 15 of the converter 1. In other words, for each branch 82, from one sub-branch 92 to the next, the cooling is done isothermally. Consequently, the network 68 as a whole produces isothermal cooling.

Each sub-branch 92 being dedicated to cooling one of the sub-modules 15, the same number of sub-branches 92 is advantageously provided as there are sub-modules 15. In the present example, six sub-branches 92 are provided per branch 82, corresponding to the six sub-modules 15 per module 3.

The sub-branches 92 of the network 68, aside from their alignment along the axes X82, are preferably aligned along axes parallel to the axis Y, from one branch 82 to the next. Alternatively, it is on the contrary possible to provide that the sub-branches 92 are offset, from one branch 82 to the next.

In the present example, the end 93 of each sub-branch 92 is advantageously aligned parallel to the axis Y with the end 94. The ends 93 and 94 of the sub-branches 92 are aligned parallel to the axis Y, from one branch 82 to another. Alternatively, it is possible to provide that, for one or several sub-branches 92, the end 93 and the end 94 are not aligned parallel to the axis Y. In particular, one end 93 can be provided near a first side of the sub-zone 98 along the axis Y, while the other end 94 is provided near an opposite side of the sub-zone 98. It is then provided that, from one branch 82 to the next, the ends 93 are distributed in several lines parallel to the axis Y, while the ends 94 are aligned along other lines parallel to the axis Y, so as to form alternating lines of ends 93 and lines of ends 94.

Preferably, as shown in FIGS. 2 and 3, each sub-branch 92 has a shape identical to the other sub-branches 92 in the plane P64, i.e., the single channel of the sub-branches 92 follows an identical outline for all of the sub-branches. In other words, the sub-branches 92 are formed by a repeating hollow pattern, formed in the face 64. Alternatively, it is possible to provide that the sub-branches 92 have a different shape in the plane P64.

The channel of each sub-branch 92 comprises a first part 95, extending from the end 93 of the channel of the sub-branch 92, up to a central point 97 of the sub-branch 92, as well as a second part 96, extending from the end 94 of the channel of the sub-branch 92 to the central point 97 of the sub-branch 92. Preferably, the part 95 is wound in a first quadrilateral spiral centered on the central point 97 and the part 96 in a second quadrilateral spiral centered on the central point 97. "Quadrilateral" means that the formed spiral draws four corners with each revolution, distributed like a quadrilateral of the rectangular or square type, as illustrated in FIG. 2. The two spirals are formed in the plane P64. The two spirals are wound in the same direction, and are interleaved in one another. Thus, moving radially away from the central point 97, the part 95 and the part 96 alternate.

This particular double spiral form makes it possible to further improve the uniformity of the temperature within the sub-module 15 cooled in this way.

Generally, it is provided that the single channel of each of the sub-branches 92 has a surface distribution in the plane P64, so as to be distributed relatively regularly over the entire sub-zone 98 in question. Alternatively, each sub-branch 92 can have a form different from a pair of quadrilateral spirals, for example two rounded interleaved spirals, rather than quadrilaterals, or a comb shape.

Irrespective of whether it is in spiral form, it is provided that the single channel of each sub-branch 92 winds, in the plane P64, along an undulation having a regular pitch. In other words, the channel extends along a zigzagging line, forming waves with a substantially equal wavelength, as illustrated in FIG. 2. In the illustrated case where each sub-branch 92 has a channel wound in two interleaved spirals, the pitch of the undulation is smaller than the largest diameter or the largest side of the spirals. The pitch of the undulation is greater than the width of the channel in question, measured in the plane XY. These dimensional considerations between the regular pitch of the undulation and the geometry of the sub-branches 92 may improve the efficiency and uniformity of the cooling, in particular in the case where the heat transfer fluid is water, optionally glycol water.

The inventors have surprisingly observed that the presence of this undulation makes it possible to improve both the cooling by making it more efficient and the uniformity of the temperature obtained in the module 3. Without wishing to link these effects to a single theory, it appears that the undulation urges the heat transfer fluid to flow in a turbulent state, with a relatively high velocity, making it possible to obtain the aforementioned effects.

In general, it is provided that the collectors of the network 68 have a depth from the face 64, measured along the axis Z, greater than that of the channels of the sub-branches 92.

As illustrated in FIGS. 2 and 3, which are advantageously to scale regarding the network 68, it is possible to provide that the passage section of the collectors of the network 68 has a value greater than that of the channels of the sub-branches 92, as is the case in the present example. Furthermore, the passage section of the collectors 77 and 78 is preferably greater than that of each collector 90 and 91.

In general, the geometry, in particular the passage section, of each branch makes it possible, when heat transfer fluid supplies the network, to obtain a heat transfer fluid flow rate with an identical value for each branch. Likewise, for each sub-branch of each branch, the geometry, in particular the passage section, of each sub-branch makes it possible, when heat transfer fluid supplies the branch, to obtain a heat transfer fluid flow rate with an identical value for each sub-branch of this branch. This particularly uniform distribution of different heat transfer fluid flow rates contributes to a particularly uniform distribution of the cooling of the power conversion modules mounted on the cooling module. The cooling module produces isothermal cooling of the power conversion modules and their sub-modules.

The features of the various alternatives mentioned above can be introduced into the other alternatives, as long as technically acceptable.

The invention claimed is:

1. A cooling module for an electric power converter, the cooling module comprising:
   a housing, which has an external support face comprising a means for fastening power conversion modules on the external support face, and
   a heat transfer fluid network, the network comprising individual heat transfer fluid branches, deviated relative to one another, each of the respective branches extending in the housing in a network plane parallel to the external support face, each of the respective branches occupying an individual zone in the network plane,
   each of the respective branches comprising:
      a heat transfer fluid supply collector,
      a heat transfer fluid discharge collector, and several individual heat transfer fluid sub-branches, each of the respective sub-branches:
being connected to the supply collector via an inlet end of each of the respective sub-branches,
being connected to the discharge collector via an outlet end of each of the respective sub-branches,
occupying an individual sub-zone comprised in the zone of each of the respective sub-branches,
being deviated relative to the other sub-branches between the supply collector and the discharge collector, and
forming a single heat transfer fluid channel that connects the inlet end to the outlet end,
wherein the single channel of each of the respective sub-branches is formed, in the network plane, with an undulation having a regular pitch.

2. The cooling module according to claim 1, wherein each of the respective sub-branches has a form identical to the other sub-branches in the network plane.

3. The cooling module according to claim 1, wherein each individual zone has an elongate shape defining a branch axis, the zones being arranged such that the branch axes are parallel to each other, the sub-zones of each of the respective branches being distributed along the branch axis of each of the respective branches.

4. The cooling module according to claim 1, wherein the single channel has a constant width.

5. The cooling module according to claim 4, wherein, for each of the respective sub-branches, the pitch of the undulation is greater than the width of the single channel in question.

6. The cooling module according to claim 1, wherein the single channel of each of the respective sub-branches comprises:
a first part, extending from the inlet end and being wound in a first spiral in the network plane, and
a second part, extending from the outlet end to the first part and being wound in a second spiral in the network plane, interleaved in the first spiral.

7. The cooling module according to claim 6, wherein each spiral, including the first spiral and the second spiral, is quadrilateral, defining four corners with each revolution.

8. The cooling module according to claim 6, wherein, for each of the respective sub-branches, the pitch of the undulation of the single channel is smaller than the largest diameter of the spirals, including the first spiral and the second spiral of each of the respective sub-branches.

9. The cooling module according to claim 1, wherein the network comprises:
a main heat transfer fluid inlet collector, connected to the supply collectors of the branches, emerging outside the housing, and
a main heat transfer fluid outlet collector, connected to the discharge collectors of the branches, emerging outside the housing.

10. The cooling module according to claim 1, wherein the fastening means comprise, for each of the respective branches, at least one orifice emerging on the surface of the external support face.

11. The cooling module according to claim 10, wherein for each of the respective branches, said at least one orifice is configured for the implantation of a screw.

12. The electric power converter, comprising: the cooling module according to claim 1,
separate power conversion modules, which each comprise:
a thermal interface plate, which comprises a components face and an external contact face opposite one another, and
separate power conversion sub-modules, each comprising at least one semiconductor component, the sub-modules being fixedly distributed on the components face;
each power conversion module being:
fastened, via the fastening means, on the external support face such that the external contact face is in contact with the external support face, and
positioned such that its thermal interface plate is across from one of the zones, and such that its sub-modules are across from sub-zones of this zone.

13. The device according to claim 12, wherein:
each sub-module occupies, projected orthogonally in the network plane, a sub-module area, and
each of the respective sub-branches is configured such that the sub-zone occupied by each of the respective sub-branches substantially coincides with the sub-module area of the opposite sub-module.

* * * * *